(12) United States Patent
Uchida et al.

(10) Patent No.: US 6,246,310 B1
(45) Date of Patent: Jun. 12, 2001

(54) NOISE SUPPRESSING APPARATUS

(75) Inventors: Katsuyuki Uchida, Hikone; Masami Sugitani, Omihachiman, both of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/443,683

(22) Filed: Nov. 18, 1999

(30) Foreign Application Priority Data

Nov. 19, 1998 (JP) .................................................. 10-329710

(51) Int. Cl.[7] ........................... H01F 17/06; H01F 27/02; H01F 27/28
(52) U.S. Cl. ........................... 336/83; 336/192; 336/175; 336/225
(58) Field of Search .............................. 336/83, 200, 225, 336/175, 192, 187

(56) References Cited

U.S. PATENT DOCUMENTS 4,777,461 * 10/1988 Sakamoto ........................... 333/184
5,821,843 * 10/1998 Mamada et al. ........................ 336/83

* cited by examiner

*Primary Examiner*—Anh Mai
(74) *Attorney, Agent, or Firm*—Keating & Bennett, LLP

(57) ABSTRACT

A noise suppressing apparatus includes a magnetic body including a ferrite, a coiled conductor extending through the magnetic body, a pair of external electrodes provided on the surface of the magnetic body so that an electric current flows through the coiled conductor therebetween and a ground electrode covering at least a main portion of the magnetic body between the external electrodes on the surface of the magnetic body.

21 Claims, 8 Drawing Sheets

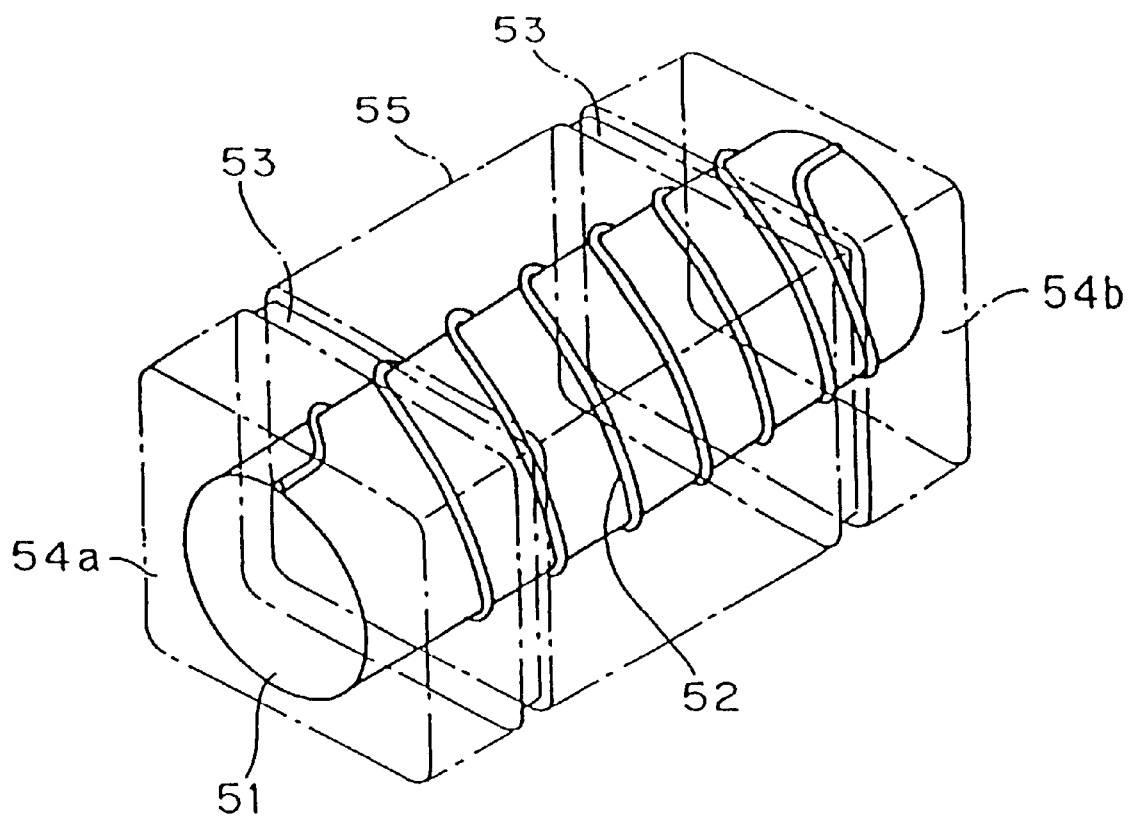

NOISE SUPPRESSING APPARATUS

BACKGROUND OF THE INVENTION

1. Field of the Invention

The present invention relates to noise suppressing apparatuses, and more particularly, to a noise suppressing apparatus for suppressing high-frequency noise radiating through an interface cable or a power cable from a circuit board.

2. Description of the Related Art

Conventionally, an inductance element having a coil provided either on the surface of ferrite or inside of ferrite has been utilized for suppressing noise leaking through a signal cable or a power cable.

A ceramic ferrite, which is commonly used for this type of inductance element, complies with Snoeks' limit. According to Snoeks' limit, the permeability of a high-permeability ceramic ferrite tends to start decreasing in a comparatively low frequency band. For example, when ferrite having a relative permeability of 500 is used, there is a tendency for the permeability of the ferrite to start decreasing in the frequency band above several megahertz and to further decrease at higher frequency bands.

In the above-described inductance element including a magnetic body such as the ceramic ferrite, a noise suppressing effect on the order of tens to hundreds of megahertz can be obtained in the low frequency band. Conversely, in a high frequency band, as the permeability of the magnetic body decreases, the noise cannot be suppressed adequately because of a decrease in the noise suppressing effect.

When a ceramic ferrite having a low permeability is used, a constant permeability is maintained up to a relatively high frequency band. However, there is a problem in that a desired impedance of the magnetic body in the high frequency band is obtained, which causes the impedance thereof to decrease in the low frequency band. When a ceramic ferrite having a relative permeability of approximately 15 is used, the permeability starts decreasing in the frequency band above approximately 100 MHz, thereby complying with Snoeks' limit. There is a problem in that the noise suppressing effect can be obtained in the frequency band below 1 GHz, whereas it cannot be sufficiently obtained in the frequency band above 1 GHz.

When a ceramic ferrite having high impedance is desired, the number of turns of the coil must be increased. However, the increase in the number of turns of the coil causes stray capacitance to increase as well. In the frequency band above a particular frequency, the stray capacitance allows noise to pass because it functions as a capacitor. Thus, the noise suppressing effect is not achieved sufficiently and thus, cannot effectively suppress noise.

T-type filters and π-type filters, obtained by combining an inductor and a capacitor, are known for suppressing noise. These filters show a remarkable noise suppressing effect, due to the combination of characteristics of the inductance and of the capacitance, up to a particular frequency. However, it is noted that the noise suppressing effect cannot be obtained sufficiently in the frequency band above the particular frequency because influences caused by residual inductance and stray capacitance prevent the noise suppressing effect from functioning properly in the high frequency band.

For example, in Japanese Unexamined Patent Publication No. 8-204486, there is disclosed a signal transmission element which defines a known noise suppressing apparatus.

FIG. 8 shows a perspective view of the signal transmission element defining the noise suppressing apparatus. In FIG. 8, a signal transmission wire 52 defines a coil by being wrapped around an insulated magnetic body 51 in the form of a ferrite rod which has a rod-like shape, and is embedded in a magnetic resin 53 obtained by combining a magnetic metal powder and a resin. A pair of external electrodes 54a and 54b are provided on the magnetic resin 53 allowing an electric current to flow through the signal transmission wire 52, and an electrode for ground connection or a ground electrode 55 is formed so as to substantially cover the entire surface of the magnetic resin 53 between the pair of external electrodes 54a and 54b.

The signal transmission element is constructed to maximize use of a magnetic loss generated by a ferromagnetic metal powder by effectively applying a high frequency magnetic field inside of the ferromagnetic metal particles in spite of the skin effect of the ferromagnetic metal. This construction enables this element to positively absorb the high-frequency signal components occurring in the high frequency domain.

However, in this noise suppressing apparatus defining the signal transmission element, although the noise suppressing effect is obtained sufficiently in the high frequency band above a gigahertz waveband, while it is not obtained in the low frequency band below a gigahertz waveband. The cutoff frequency of this noise suppressing apparatus is defined as the frequency at which the attenuation value of the transmission characteristic is about −3 dB. Since a noise suppressing effect with the attenuation value of only −10 dB or lower is obtained in the low frequency band below a gigahertz waveband, it is difficult to obtain the desired noise suppressing effect substantially in the low frequency band below a gigahertz waveband.

SUMMARY OF THE INVENTION

To overcome the problems described above, preferred embodiments of the present invention provide a noise suppressing apparatus that is constructed to produce a noise suppressing effect in a high frequency band above a gigahertz waveband as well as a noise suppressing effect in a low frequency band below a gigahertz waveband.

To this end, a preferred embodiment of the present invention provides a noise suppressing apparatus including a magnetic body including a ferrite, a coiled conductor provided in the magnetic body, a pair of external electrodes provided on the surface of the magnetic body and electrically connected to both ends of the coiled conductor, and a ground electrode disposed between the pair of external electrodes and covering at least a main portion of the surface of the magnetic body.

The coiled conductor is disposed in the magnetic body including ferrite material so that the magnetic body functions as a magnetic shield. Because the ground electrode is further disposed between the pair of external electrodes arranged along the magnetic body so as to cover at least a main portion of the surface of the magnetic body, an electromagnetic wave absorption function is achieved due to the combined actions of the magnetic body and the ground electrode. Therefore, the emission of noise is efficiently suppressed due to the magnetic shield function of the magnetic body, and moreover, some of the noise, which is not suppressed by only the magnetic shield function of the magnetic body, is absorbed by the combined actions of the magnetic body and the ground electrode, which can sufficiently suppress the emission of noise.

The longer the length of the wire conductor, the greater the noise suppressing effect which can be obtained. Since the conductor is arranged in a coil configuration, the required wire length can be secured without causing an increase in size of a product including the conductor, which enables a sufficient noise suppressing effect to be obtained. In the noise suppressing apparatus of this invention, the noise suppressing effect is achieved from around approximately 300 MHz, and it can be sufficiently obtained up to several gigahertz.

In a noise suppressing apparatus according to another preferred embodiment of the present invention, the magnetic body including the ferrite may be a magnetic resin obtained by dispersing a ferrite powder in a resin.

By using as a magnetic body, the magnetic resin obtained by dispersing the ferrite powder in the resin, a magnetic body having ferrite sufficiently dispersed therein is obtained. In addition, this magnetic body can be molded into a desired shape, which is capable of enhancing characteristics of the magnetic body as well as the degree of freedom of the design thereof. When the magnetic resin is used, because a process of sintering is unnecessary, a reduction in production costs is achieved by simplification of the manufacturing process.

It is said that the magnetic resin, obtained by dispersing the ferrite powder into the resin, provides an electromagnetic wave absorption effect. However, a mere combination of the coil and the magnetic resin does not produce a significant electromagnetic wave absorption effect. A substantial noise suppressing effect can be obtained, such as in preferred embodiments of the present invention, by arranging a conductor (the ground electrode) so as to substantially cover the entire outer surface of the magnetic body, and by connecting the ground electrode to the ground.

Such a noise suppressing effect cannot be obtained when only a conductor that is connected to the ground so as to define a ground electrode, is disposed at the periphery of the coiled conductor. The above remarkable noise suppressing effect can be obtained for the first time through a combination of the magnetic body and the ground electrode covering the outer surface of the magnetic body. This is because a novel combined action is achieved by combining the magnetic body covering the coiled body and the ground electrode arranged to cover the outer surface of the magnetic body.

In a noise suppressing apparatus according to another aspect of preferred embodiments of the present invention, the magnetic body including the ferrite may be a ceramic ferrite.

In a noise suppressing apparatus of this preferred embodiment, the ceramic ferrite can be used to define the magnetic body. The noise suppressing apparatus obtained in this preferred embodiment has as great an effect as the magnetic body obtained by using the magnetic resin of the above-described preferred embodiment.

It has been generally believed that ceramic ferrite does not achieve electromagnetic wave absorption effects. However, it was confirmed that a construction in which the conductor defining the ground electrode is arranged to cover the outer surface of the ceramic ferrite and is connected to the ground, has the same effect as a construction in which the magnetic resin is obtained by dispersing the magnetic ferrite powder in a resin. The noise suppressing effect obtained in this preferred embodiment depends on the permeability of the ceramic ferrite. In the high frequency band, the noise suppressing effect is not significantly obtained when a ceramic ferrite with high permeability is used, while sufficient effects are obtained by using a ceramic ferrite with low permeability.

The principle of obtaining the electromagnetic wave absorption effect due to the ceramic ferrite is not fully understood at present. This is presumably because a novel action is exerted by combining the ceramic ferrite and arranging the conductor defining the ground electrode and connected to the ground so as to cover the outer surface of the ceramic ferrite.

In a noise suppressing apparatus according to another preferred embodiment of the present invention, the noise suppressing apparatus may further include a high permeability ferrite magnetic body provided at the inner periphery of the coiled conductor and a low permeability ferrite magnetic body having a permeability that is lower than that of the high permeability ferrite magnetic body provided at the outer periphery of the coiled conductor.

When the high permeability ferrite magnetic body is provided at the inner periphery of the coiled conductor and the low permeability ferrite magnetic body is provided at the outer periphery of the coiled conductor, the effects obtained in this case are as follows. Since the high permeability ferrite magnetic body is disposed inside of the coil, a high impedance is obtained by applying an electric current of high frequency to the coil. According to Snoeks' limit, as the permeability of the high permeability ferrite magnetic body becomes higher, the permeability of the high permeability ferrite magnetic body begins to decrease at the lower frequency band. A noise suppressing effect on the order of tens to between 200 and 300 MHz, caused by the impedance of the high permeability ferrite magnetic body, is obtained in the low frequency band, although there are variations between permeabilities of the individual magnetic bodies. Thus, a ferrite magnetic body with relative permeability approximately equal to or higher than 100 is preferable in order to obtain the high impedance in the low frequency band up to between 200 and 300 MHz.

The low permeability ferrite magnetic body having a permeability that is lower than that of the high permeability ferrite magnetic body provided inside of the coil is provided outside of the coil, and the conductor, connected to the ground, is arranged to cover the outer surface of the low permeability ferrite magnetic body. By exerting the electromagnetic wave absorption effect in combination with the above actions, the noise suppressing effect is obtained in the high frequency band.

Thus, by providing the high permeability ferrite magnetic body inside of the coil as well as the low permeability ferrite magnetic body outside of the coil with permeability lower than that of the high permeability ferrite magnetic body, the noise suppressing effect is sufficiently obtained in a broad frequency band.

When the length of the wire in the conductor is increased by winding more turns of the coil, the electromagnetic wave absorption effect caused by the low permeability ferrite magnetic body provided outside of the coil is improved, and the impedance caused by the high permeability ferrite magnetic body provided inside of the coil is greatly improved. Therefore, the noise suppressing effect is sufficiently obtained in a broader frequency band.

In a noise suppressing apparatus in another preferred embodiment of the present invention, the low permeability ferrite magnetic body provided outside of the coiled conductor may be formed of a magnetic resin obtained by dispersing a ferrite powder in a resin.

By using the magnetic resin obtained by dispersing the ferrite powder in the resin as a low permeability ferrite magnetic body arranged outside of the coil, the magnetic resin can be formed around the coil while the shape of the coil is maintained by the magnetic body arranged inside of the coil. Therefore, as a consequence of forming the magnetic body, deformation of the coil is prevented, and variations in the characteristics of the noise suppressing apparatus according to this preferred embodiment can be reduced, which enables the present invention to be more effective.

In a noise suppressing apparatus according to another preferred embodiment of the present invention, relative permeability of the high permeability ferrite magnetic body is preferably equal to or greater than about 100, while the relative permeability of the low permeability ferrite magnetic body is equal to or lower than about 100.

By using as a high permeability ferrite magnetic body, a magnetic body having a relative permeability equal to or greater than about 100, a high impedance can be securely obtained in the low frequency band between 200 and 300 MHz. On the other hand, by using as a low permeability ferrite magnetic body, a magnetic body having a relative permeability equal to or lower than about 100, the noise emission in the high frequency band such as the gigahertz waveband is sufficiently suppressed.

In a noise suppressing apparatus according to another preferred embodiment of the present invention, the length of the coiled conductor which is in a state that conductive wire is before forming the coil shape may be equal to or more than about 5 cm.

By using a coiled conductor having a wire length of about 5 cm or more, the noise suppressing effect with an attenuation value equal to or greater than about 10 dB can be obtained at 1 GHz. The greater the length of the coiled conductor, the more the noise suppressing effect improves.

These and other features, elements, advantages and modifications thereof will become more apparent from the detailed description of preferred embodiments below with reference to the attached drawings.

BRIEF DESCRIPTION OF THE DRAWINGS

For the purpose of illustrating the present invention, there is shown in the drawings several forms and embodiments which are presently preferred, it being understood, however, that the invention is not limited to the precise arrangements and instrumentalities shown.

FIG. 8 is a perspective view of a conventional noise suppressing apparatus which defines a signal transmission component.

DETAILED DESCRIPTION OF PREFERRED EMBODIMENTS

Preferred embodiments of the present invention will now be explained in detail with reference to the drawings.

Figure 1A:
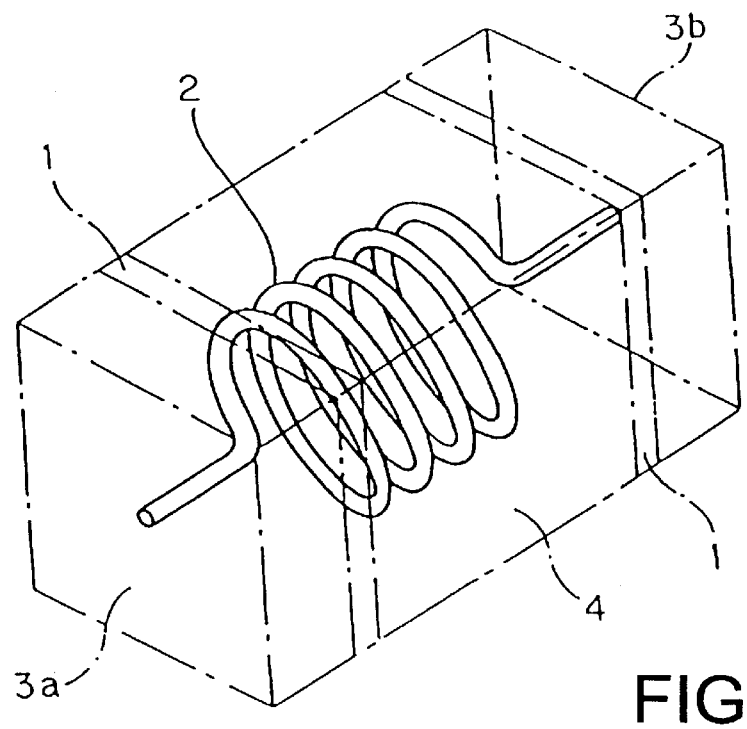
FIG. 1A is a perspective view of the internal structure of a noise suppressing apparatus according to a first preferred embodiment of the present invention.
Figure 1B:
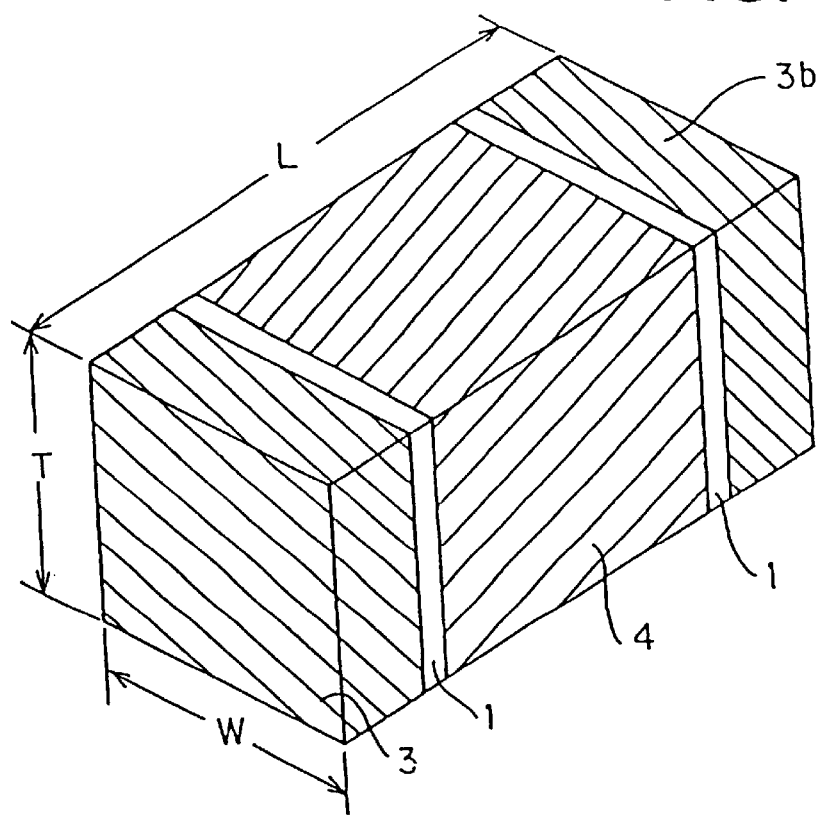
FIG. 1B is a perspective view of the external structure of a noise suppressing apparatus according to the first preferred embodiment of the present invention.

FIG. 1A and 1B show a noise suppressing apparatus in accordance with a first preferred embodiment of the present invention. FIG. 1A shows a perspective view of the internal structure thereof, and FIG. 1B shows a perspective view of the external structure thereof.

As shown in FIG. 1, the noise suppressing apparatus preferably includes a coiled conductor 2 disposed in a magnetic body 1, such as a ferrite magnetic body, preferably having a substantially rectangular parallelepiped shape and including ferrite material, so that both ends of the coiled conductor 2 are exposed at the ends of the magnetic body 1 in the longitudinal direction thereof. A pair of external electrodes 3a and 3b are disposed at opposite ends of the magnetic body 1 so that both ends of the coiled conductor 2 are electrically connected to the external electrodes 3a and 3b respectively, and a ground electrode 4 is disposed so as to substantially cover the entire surface of the magnetic body 1.

This preferred embodiment will be more clearly understood with reference to the following example.

In the noise suppressing apparatus of this example, the coiled conductor 2 preferably includes an insulator-coated copper wire having a diameter of approximately 0.2 mm and is arranged to form a coil having 20 turns so that the inner diameter of the coil is about 2.0 mm. The length of the coiled conductor 2 in the wound state, as indicated by the length "L" in FIG. 1B, was approximately 4.5 mm, while the length in the expanded state before forming the coil shape, that is, the length of the wire is approximately 13 cm.

The noise suppressing apparatus of FIG. 1 is obtained preferably as follows. Initially, a magnetic resin (a material of the magnetic body 1) is obtained by mixing about 80% by weight of ferrite magnetic powder and about 20% by weight of a polyphenylene sulfide resin (referred to as PPS resin hereinafter). A molded body in which the coiled conductor 2 is embedded in the magnetic body 1 is formed by performing injection-molding of the magnetic resin. Finally, by forming external electrodes 3a and 3b at both ends of the molded body as well as the ground electrode 4 so as to cover the surface of the magnetic body 1 between external electrodes 3a and 3b, the noise suppressing apparatus of FIG. 1 is obtained. The relative permeability of the magnetic resin (the magnetic body 1) obtained in this preferred embodiment is 12.

The size of the noise suppressing apparatus of this preferred embodiment is approximately 4.5 mm in length (corresponding to "L" in FIG. 1B) and approximately 3.2 mm in width (corresponding to "W" in FIG. 1B) and in thickness (corresponding to "T" in FIG. 1B).

Signal characteristics are measured with the noise suppressing apparatus connected to a network analyzer. Specifically, the transmission and reflection characteristics of the noise suppressing apparatus are measured with the respective external electrode 3a and 3b of the coiled conductor 2 connected to input and output ports of the network analyzer, and the ground electrode 4 connected to a ground unit of the input port (port 1) of the network analyzer. For comparison, the transmission and the reflection characteristics are further measured under the above conditions except that the ground electrode 4 and the ground unit of the input port of the network analyzer are not connected.

Figure 2:
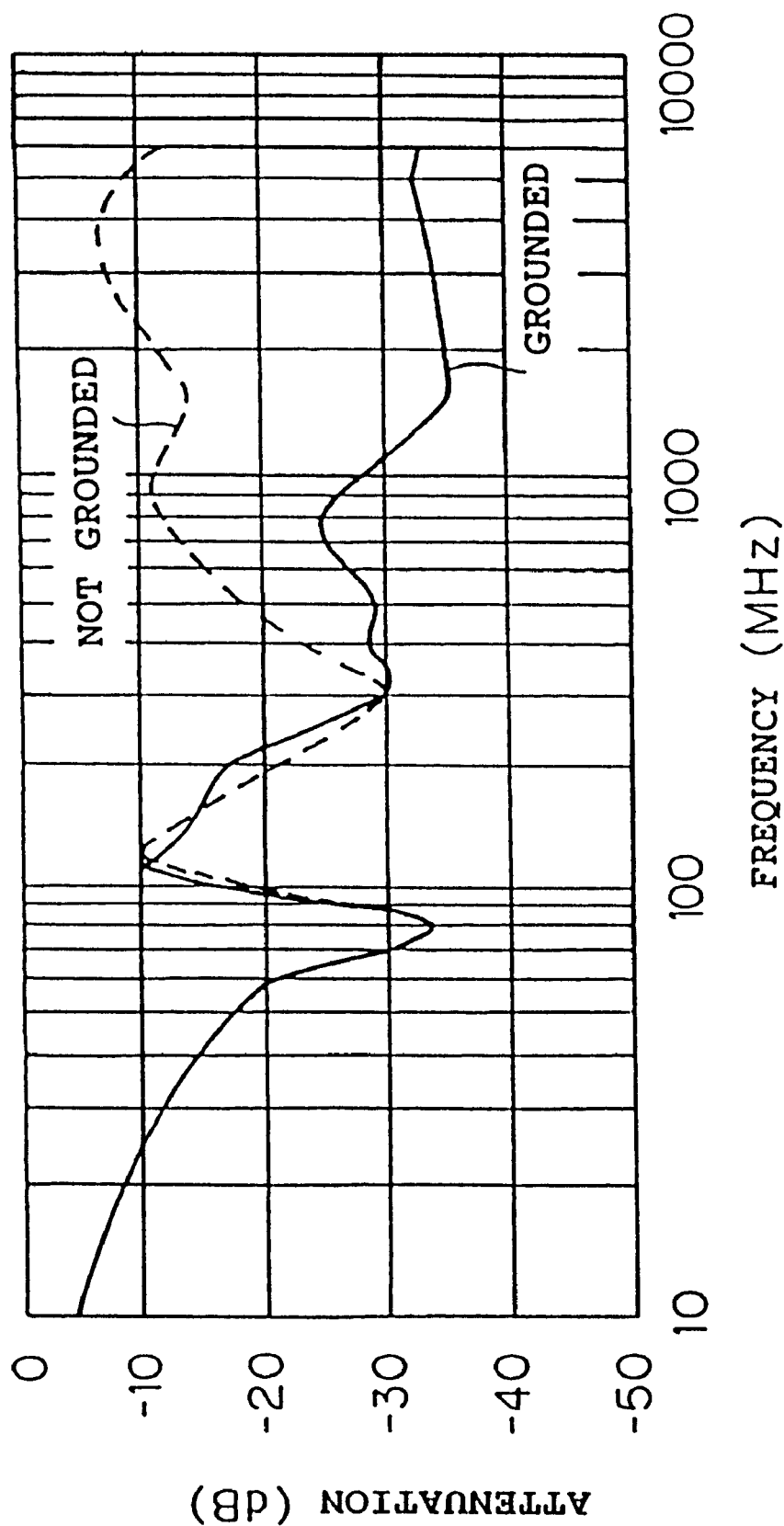
FIG. 2 is a diagram showing the results of measurements of the transmission characteristics of the noise suppressing apparatus in accordance with the first preferred embodiment of the present invention.
Figure 3:
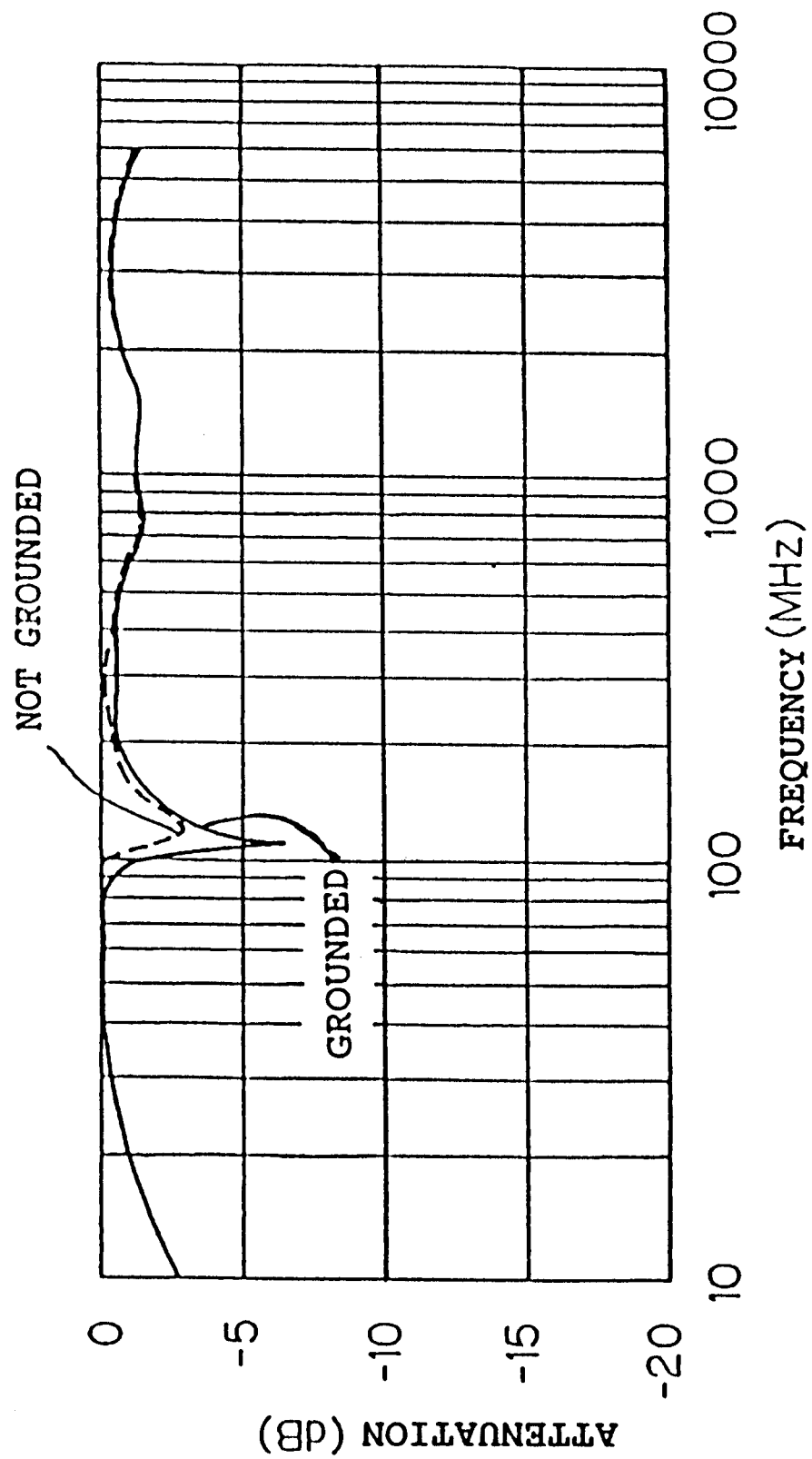
FIG. 3 is a diagram showing the results of measurements of the reflection characteristics of the noise suppressing apparatus in accordance with the first preferred embodiment of the present invention.

FIG. 2 illustrates the results of measurements of the transmission characteristics, and FIG. 3 illustrates the results of measurements of the reflection characteristics.

As shown in FIG. 2, comparing a case in which the ground electrode 4 is connected to the ground unit of the network analyzer with a case in which the ground electrode is not connected, it is determined that the attenuation (the transmission attenuation) is greater in the frequency band of approximately 300 MHZ or higher.

As shown in FIG. 3, comparing a case in which the ground electrode 4 is connected to the ground unit of the network analyzer with the case in which the ground electrode is not connected, it is determined that the quantity of a reflected high frequency signal is smaller. That is, in a case in which the ground electrode 4 is connected to the ground unit of the network analyzer, the quantity of a high frequency signal transmitted from the port 1 of the network analyzer is greater, while the quantity of signal reaching a port 2 of the network analyzer is less. Therefore, the difference between the quantities of input and output signal indicates the quantity of electromagnetic waves absorbed by connecting the ground electrode 4 to the ground unit of the network analyzer.

The reasons for these results are as follows: the magnetic characteristics of the ferrite magnetic body 1 are not produced in the high frequency band greater than the gigahertz band, and the noise suppressing effect, caused by the inductance and the capacitance of the ground electrode under the influence of residual inductance and stray capacitance, cannot be maintained up to several gigahertz.

As described above, this preferred embodiment of the present invention enables the noise suppressing apparatus to have adequate noise suppressing effects in a broad frequency band due to combined actions of the magnetic body 1 including ferrite and the ground electrode 4 disposed so as to cover the magnetic body 1.

The second preferred embodiment will be more clearly understood with reference to the following example.

A noise suppressing apparatus according to the second preferred embodiment of the present invention is prepared having a construction generally the same as that of the noise suppressing apparatus according to the first preferred embodiment. However, in the second preferred embodiment, a silver wire having a diameter of about 0.2 mm is preferably used as a coiled conductor to provide a coil having 10 turns so that the inner diameter of the coil is approximately 1.4 mm. Slurry for the ceramic ferrite is molded so as to cover the coiled conductor, and sintered. A molded body is thus formed with a construction having the coiled conductor disposed in the magnetic body. Finally, by forming external electrodes at opposite ends of the molded body as well as a ground electrode arranged to cover the surface of the magnetic body between the external electrodes, a noise suppressing apparatus is obtained.

In the second preferred embodiment, ceramic ferrites having relative permeabilities of approximately 500 and approximately 20 are prepared as magnetic bodies.

The size of the noise suppressing apparatus is preferably about 4.5 mm in length and about 3.2 mm in width and thickness.

Using the noise suppressing apparatus as constructed above, transmission characteristics are measured with the noise suppressing apparatus connected to the network analyzer in the same manner as that of the first preferred embodiment.

Figure 4:
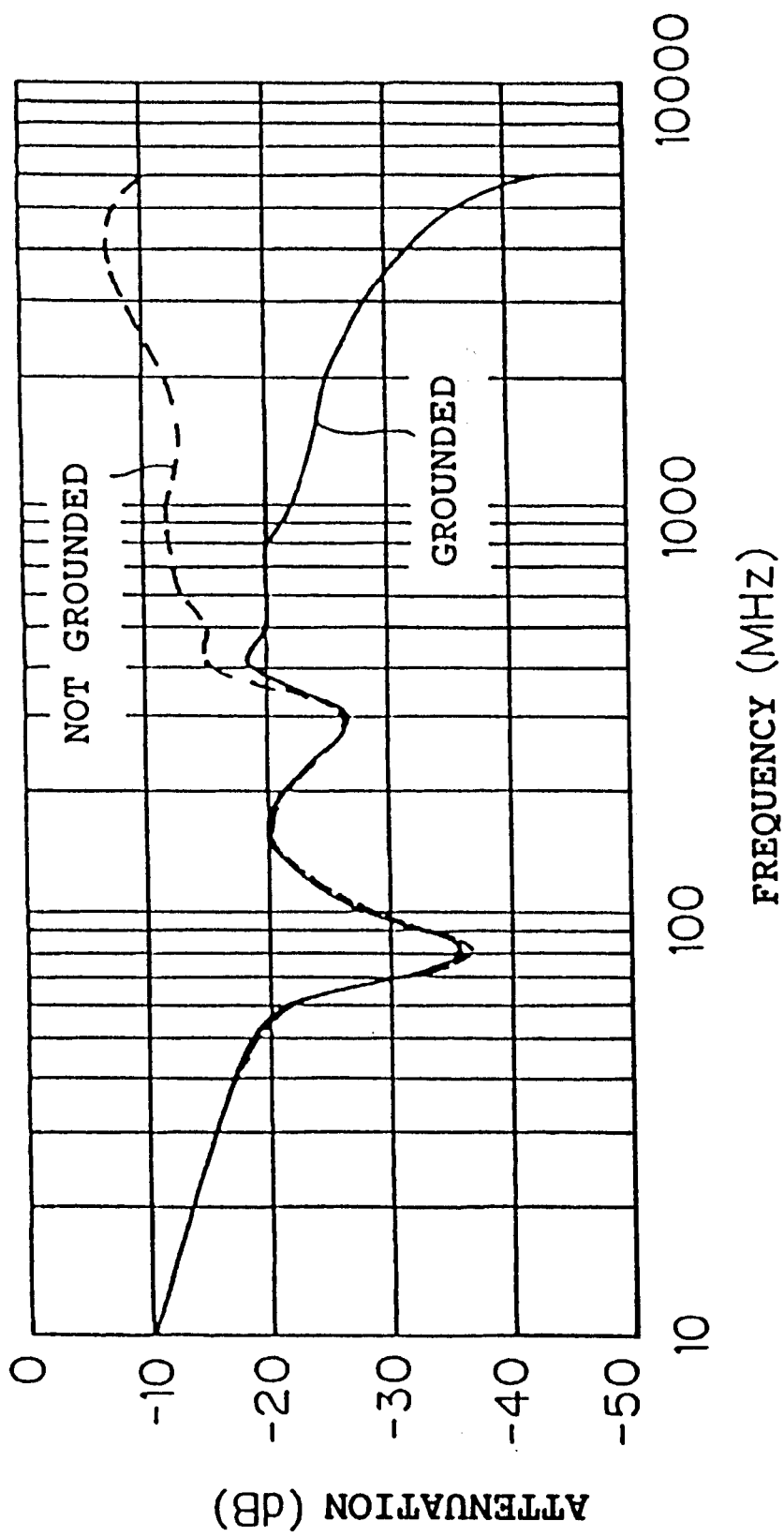
FIG. 4 is a diagram showing the transmission characteristics of a noise suppressing apparatus in accordance with a second preferred embodiment of the present invention using a ceramic ferrite having a relative permeability of about 500.
Figure 5:
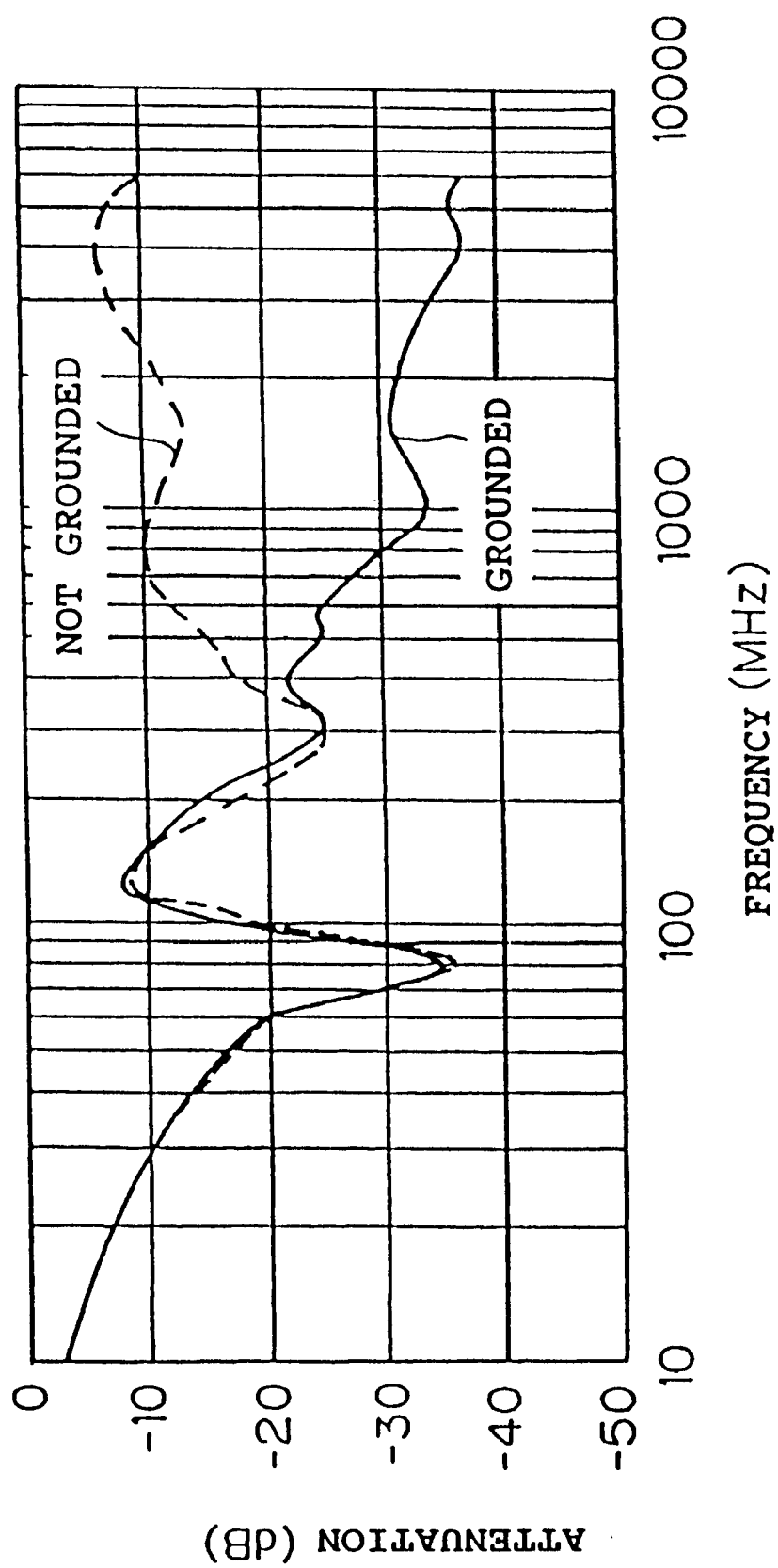
FIG. 5 is a diagram showing the transmission characteristics of the noise suppressing apparatus in accordance with the second preferred embodiment of the present invention using a ceramic ferrite having a relative permeability was about 20.

FIG. 4 illustrates transmission characteristics of the noise suppressing apparatus including the ceramic ferrite having relative permeability of about 500, and FIG. 5 illustrates transmission characteristics of the noise suppressing apparatus including the ceramic ferrite having a relative permeability of about 20.

As shown in FIGS. 4 and 5, in both cases of including the ceramic ferrites having relative permeabilities of 500, the quantity of the attenuation (the transmission attenuation) is sufficiently great, which means that the noise suppressing effect is obtained. However, it is discovered that the noise suppressing effect differs depending on the relative permeability of the ceramic ferrite used. Regardless of whether or not the ground electrode is grounded, the quantity of the attenuation is greater in the frequency band of approximately 100 MHz to 300 MHz in a case in which the ceramic ferrite with a relative permeability of 500 is used, compared with a case in which the one with a relative permeability of 20 is used. Conceivably, the quantity of the attenuation is greater in a case in which the ceramic ferrite with the higher permeability is used, since a noise suppressing action is achieved greatly due to the impedance caused by the magnetic body in this frequency band.

In addition, the quantity of the attenuation is less in the frequency band of about 300 MHz to several GHz in a case in which the ceramic ferrite having a relative permeability of about 500 is used, compared with a case in which the ceramic ferrite with a relative permeability of about 20 is used.

The reasons for the above results are as follows. In the noise suppressing apparatus including the ceramic ferrite having a relative permeability of about 500, the noise suppressing action, due to the impedance caused by the magnetic body, decreased, which leads the quantity of the attenuation to decrease. In the apparatus including the ceramic ferrite having a relative permeability of about 20, the noise suppressing effect with the low permeability increased in the high frequency band, and the electromagnetic wave absorption effect, due to the combined actions of the magnetic body and the ground electrode covering the magnetic body, increased, which causes the quantity of the attenuation to increase.

Figure 6:
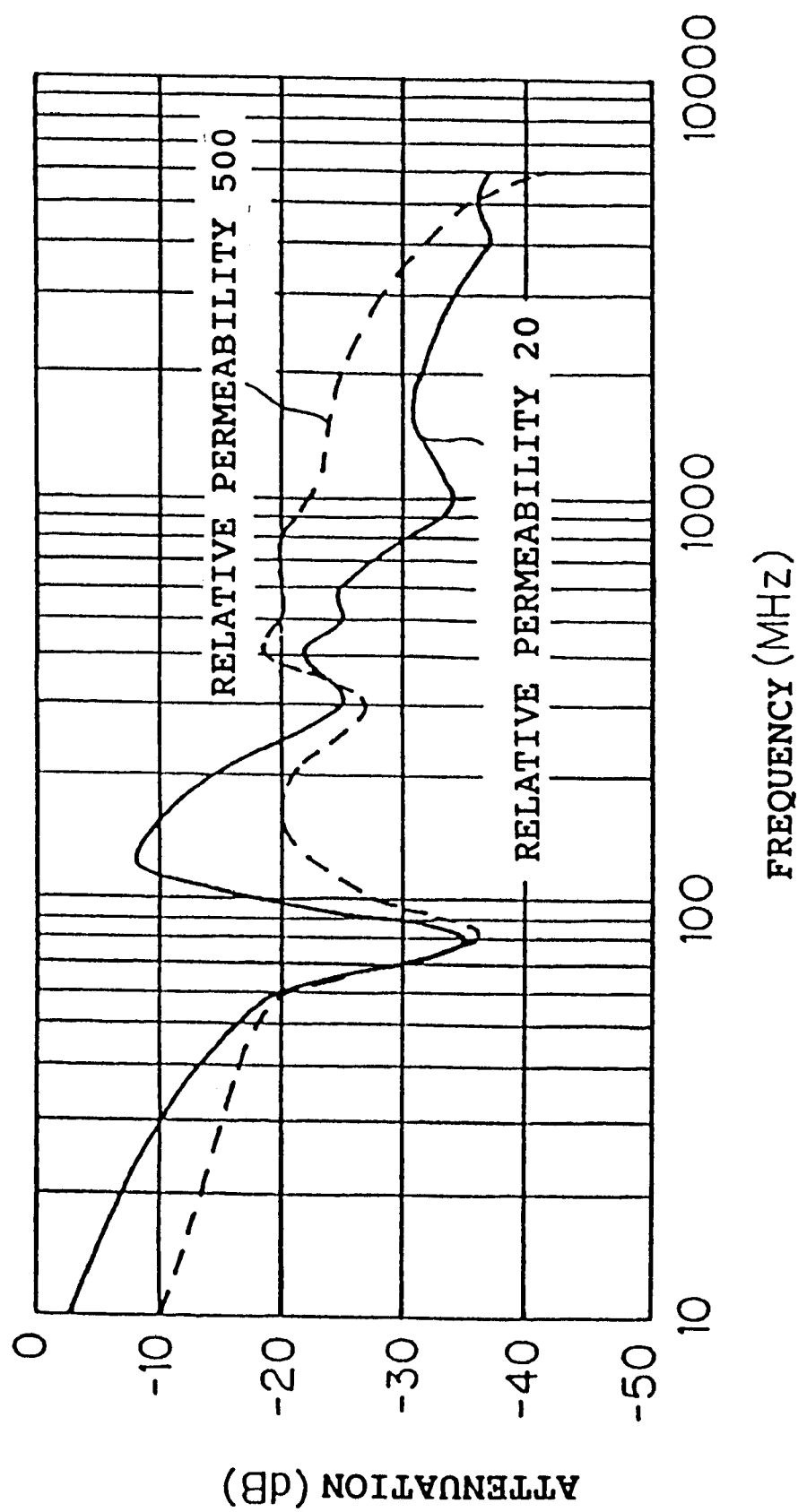
FIG. 6 is a diagram showing the relationship between the relative permeability of and the transmission characteristic of a magnetic body included in the noise suppressing apparatus in accordance with the second preferred embodiment of the present invention.

FIG. 6 illustrates the comparison of the attenuations (transmission attenuations) measured by connecting the ground electrode to a ground unit of a network analyzer in cases in which the ceramic ferrites with relative permeabilities of about 500 and about 20 were used.

As shown in FIG. 6, the quantity of the attenuation is greater up to about 300 MHz where the noise suppressing apparatus includes the ceramic ferrite having a relative permeability of about 500, whereas it is greater above about 300 MHz where the apparatus includes the ceramic ferrite having a relative permeability of about 20. Conceivably, this is because the noise suppression effect, obtained by the electromagnetic wave absorption effect due to the combined actions of the magnetic body and the ground electrode covering the magnetic body, dominates over the effect obtained by the magnetic body with the low permeability in the frequency band above about 300 MHz.

Figure 7A:
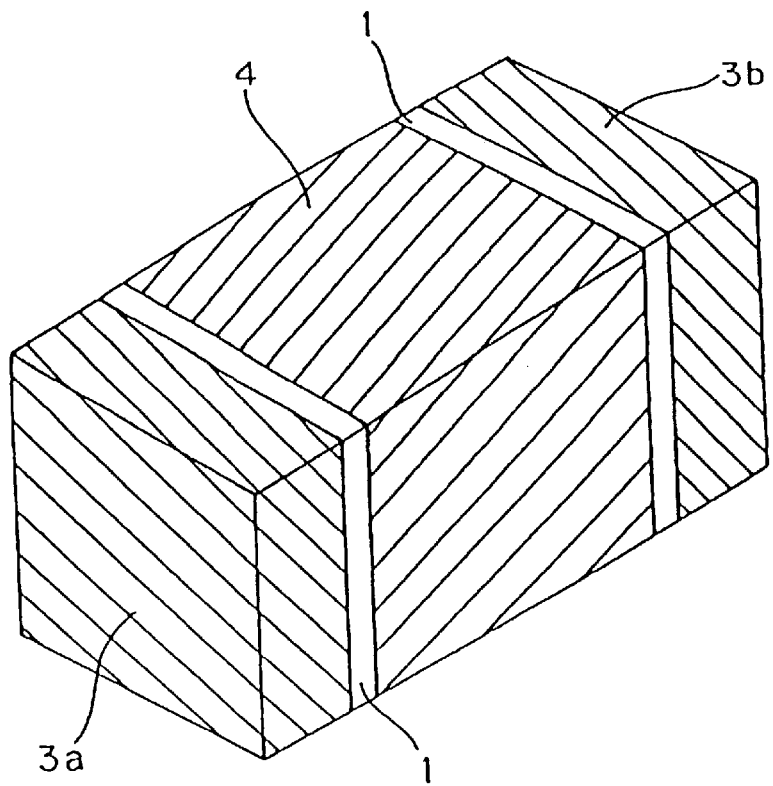
FIG. 7A is a perspective view of the internal structure of a noise suppressing apparatus in accordance with a third preferred embodiment of the present invention.
Figure 7B:
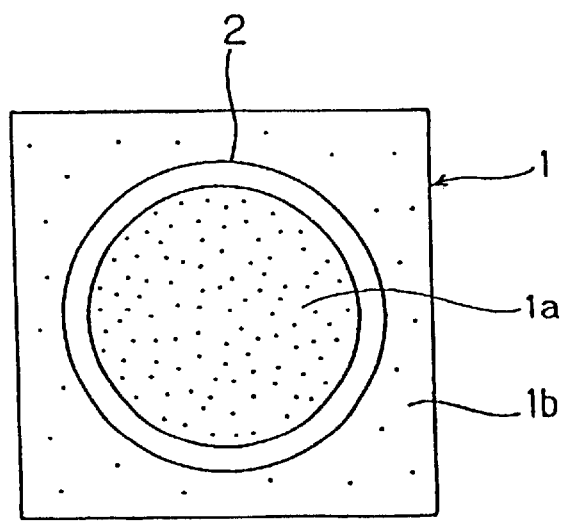
FIG. 7B is a perspective view of the external structure of a noise suppressing apparatus in accordance with a third preferred embodiment of the present invention.

As shown in FIGS. 7A and 7B, a noise suppressing apparatus according to a third preferred embodiment of the present invention includes a coiled conductor 2 disposed in a magnetic body 1 having a substantially rectangular parallelepiped shape and including a ferrite so that opposite ends of the coiled conductor 2 are exposed at the ends of the magnetic body 1 in the longitudinal direction, a pair of external electrodes 3a and 3b disposed at opposite ends of the magnetic body 1 so that both ends of the coiled conductor 2 are electrically connected between the external electrodes 3a and 3b, and a ground electrode 4 disposed so as to substantially cover the entire surface of the magnetic body 1.

This preferred embodiment will be more clearly understood with reference to the following example.

In the noise suppressing apparatus according to the third preferred embodiment, the magnetic body 1 includes a high permeability ferrite magnetic body 1a disposed at the inner periphery of the coiled conductor 2, and a low permeability ferrite magnetic body 1b, having a permeability that is lower than that of the high permeability ferrite magnetic body 1a, disposed at the outer periphery of the coiled conductor 2. Ceramic ferrite having a relative permeability of about 500 is used as the high-permeability ferrite magnetic body 1a. Magnetic resin having a relative permeability of about 12, which is the same one as used in the first preferred embodiment, is preferably used as the low permeability ferrite magnetic body 1b in which about 80% by weight of ferrite magnetic powder and about 20% by weight of a PPS resin are mixed.

Concerning the noise suppressing apparatus according to the third preferred embodiment, as a result of measuring its transmission characteristics (transmission attenuation, particularly, not shown) in the same manner as that in the above-described first preferred embodiment, the remarkable effect is obtained in which the quantity of the transmission attenuation increased from approximately 100 MHz, and in the frequency band of 300 MHz to several GHz, the quantity of the attenuation is nearly as great as that of the attenuation obtained in the first preferred embodiment as shown in FIG. 2.

The noise suppressing apparatus according to the third preferred embodiment achieves the noise suppressing effect due to the impedance of the high permeability ferrite magnetic body as well as a large electromagnetic wave absorption effect due to the combined actions of the low permeability magnetic body and the ground electrode in the high frequency band. Therefore, this noise suppressing apparatus provides excellent and sufficient noise suppressing effects in a broad frequency band.

The present invention is not limited to the foregoing preferred embodiments. On the contrary, the present invention is intended to cover various modifications and equivalent arrangements. For example, the exact configuration and the number of turns of the coiled conductor, the length of the wire, the exact composition and configuration of the magnetic body, patterns and forming methods of the external and ground electrodes, and the like, may be changed and still be within the scope of the present invention.

What is claimed is:

1. A noise suppressing apparatus comprising:
   a magnetic body;
   a coiled conductor provided in said magnetic body;
   a pair of external electrodes provided on the surface of the magnetic body and electrically connected to opposite ends of said coiled conductor; and
   a ground electrode disposed between said pair of external electrodes and covering at least a main portion of the surface of said magnetic body; wherein
   the ground electrode extends along four sides of the magnetic body.

2. The noise suppressing apparatus according to claim 1, wherein said magnetic body includes a ferrite.

3. A noise suppressing apparatus according to claim 1, wherein said magnetic body includes a magnetic resin.

4. The noise suppressing apparatus according to claim 3, wherein said magnetic resin includes a resin having ferrite powder dispersed therein.

5. The noise suppressing apparatus according to claim 3, wherein the relative permeability of the magnetic resin is about 12.

6. A noise suppressing apparatus according to claim 1, wherein said magnetic body includes a ceramic ferrite.

7. A noise suppressing apparatus comprising:
   a magnetic body;
   a coiled conductor provided in said magnetic body;
   a pair of external electrodes provided on the surface of the magnetic body and electrically connected to opposite ends of said coiled conductor; and
   a ground electrode disposed between said pair of external electrodes and covering at least a main portion of the surface of said magnetic body;
   a high permeability ferrite magnetic body provided inside of said coiled conductor; and
   a low permeability ferrite magnetic body having a permeability lower than that of said high permeability ferrite magnetic body provided on an outside of said coiled conductor.

8. A noise suppressing apparatus according to claim 7, wherein said low permeability ferrite magnetic body includes 80% by weight of ferrite magnetic powder and about 20% by weight of a PPS resin.

9. A noise suppressing apparatus according to claim 7, wherein said low permeability ferrite magnetic body provided outside said coiled conductor includes a magnetic resin.

10. A noise suppressing apparatus according to claim 9, wherein the magnetic resin includes a resin having a ferrite dispersed therein.

11. A noise suppressing apparatus according to claim 7, wherein the relative permeability of said high permeability ferrite magnetic body is about 100 or greater, and the relative permeability of said low-permeability ferrite magnetic body is about 100 or lower.

12. A noise suppressing apparatus according to claim 1, wherein the length of said coiled conductor is about 5 cm or more.

13. A noise suppressing apparatus comprising:
   a magnetic body;
   a coiled conductor provided in said magnetic body;
   a pair of external electrodes provided on the surface of the magnetic body and electrically connected to opposite ends of said coiled conductor; and
   a ground electrode disposed between said pair of external electrodes and covering at least a main portion of the surface of said magnetic body; wherein said magnetic body includes a ceramic ferrite and a relative permeability of said magnetic body is about 500.

14. A noise suppressing apparatus comprising:

a magnetic body;

a coiled conductor provided in said magnetic body;

a pair of external electrodes provided on the surface of the magnetic body and electrically connected to opposite ends of said coiled conductor; and a ground electrode disposed between said pair of external electrodes and covering at least a main portion of the surface of said magnetic body; wherein said magnetic body includes a ceramic ferrite and a relative permeability of said magnetic body is about 20.

15. A noise suppressing apparatus comprising:

a magnetic body;

a coiled conductor provided in said magnetic body;

a pair of external electrodes provided on the surface of the magnetic body and electrically connected to opposite ends of said coiled conductor; and a ground electrode disposed between said pair of external electrodes and covering at least a main portion of the surface of said magnetic body; wherein the coiled conductor includes a plurality of turns and the ground electrode extends along the magnetic body so as to cover most of the turns of the coiled conductors.

16. A noise suppressing apparatus comprising:

a magnetic body;

a coiled conductor provided in said magnetic body;

a pair of external electrodes provided on the surface of the magnetic body and electrically connected to opposite ends of said coiled conductor; and a ground electrode disposed between said pair of external electrodes and covering at least a main portion of the surface of said magnetic body; wherein the coiled conductor includes a plurality of turns and the ground electrode extends along the magnetic body so as to cover all of the turns of the coiled conductors.

17. A noise suppressing apparatus comprising:

a magnetic body;

a coiled conductor provided in said magnetic body;

a pair of external electrodes provided on the surface of the magnetic body and electrically connected to opposite ends of said coiled conductor; and a ground electrode disposed between said pair of external electrodes and covering at least a main portion of the surface of said magnetic body; wherein the ground electrode extends from a central portion of the magnetic body towards the opposite ends of the magnetic body to a location adjacent but spaced from ends of the external electrodes.

18. A noise suppressing apparatus according to claim 17, wherein the magnetic body includes a ferrite.

19. A noise suppressing apparatus according to claim 18, wherein said magnetic resin includes a resin having ferrite powder dispersed therein.

20. A noise suppressing apparatus according to claim 17, wherein said magnetic body includes a ceramic ferrite.

21. A noise suppressing apparatus according to claim 17, wherein the length of said coiled conductor is about 5 cm or more.

* * * * *